(12) United States Patent
Jiang et al.

(10) Patent No.: US 12,408,278 B2
(45) Date of Patent: Sep. 2, 2025

(54) ELECTRONIC MODULE ASSEMBLY STRUCTURE

(71) Applicant: Delta Electronics, Inc., Taoyuan (TW)

(72) Inventors: Kun Jiang, Shanghai (CN); Xi Liu, Shanghai (CN); Jianxin Chen, Shanghai (CN); Geguo Men, Shanghai (CN)

(73) Assignee: Delta Electronics, Inc., Taoyuan (TW)

( * ) Notice: Subject to any disclaimer, the term of this patent is extended or adjusted under 35 U.S.C. 154(b) by 569 days.

(21) Appl. No.: 17/974,785

(22) Filed: Oct. 27, 2022

(65) Prior Publication Data
US 2023/0146529 A1 May 11, 2023

(30) Foreign Application Priority Data

Nov. 11, 2021 (CN) .......................... 202111331384.1

(51) Int. Cl.
*H05K 3/00* (2006.01)
*H01F 41/02* (2006.01)
*H05K 1/02* (2006.01)
*H05K 3/34* (2006.01)

(52) U.S. Cl.
CPC ....... *H05K 3/3494* (2013.01); *H01F 41/0206* (2013.01); *H05K 1/0298* (2013.01)

(58) Field of Classification Search
CPC . H05K 3/3494; H05K 1/0298; H01F 41/0206
USPC ....................................................... 361/601
See application file for complete search history.

(56) References Cited

U.S. PATENT DOCUMENTS

| 5,199,889 A * | 4/1993 | McDevitt, Jr. ....... H05K 7/1084 439/71 |
| 2003/0137808 A1* | 7/2003 | Kledzik ................ H01L 25/105 361/708 |
| 2003/0168738 A1* | 9/2003 | Kabadi .................. H01R 12/52 257/738 |
| 2009/0135571 A1* | 5/2009 | Chiang ................ H05K 3/3426 439/74 |

(Continued)

FOREIGN PATENT DOCUMENTS

| CN | 107949182 A | 4/2018 |
| CN | 113194630 A | 7/2021 |

*Primary Examiner* — Zhengfu J Feng
(74) *Attorney, Agent, or Firm* — KIRTON McCONKIE; Evan R. Witt

(57) ABSTRACT

The present disclosure is related to an electronic module assembly structure including a system board, an electronic module and an adhesive material. The system board includes a first upper surface and a first lower surface opposite to each other. The electronic module spatially corresponds to the first upper surface and includes plurality leading pins and a carrier. Each leading pin has a soldering surface and is connected to the first upper surface through a first reflow soldering process. When the plurality leading pins are connected to the first upper surface, a height difference is formed between the carrying surface of the carrier and the soldering surfaces. The adhesive material is disposed on the carrying surface or the first upper surface. The carrier is connected with the first upper surface through the adhesive material, so that the electronic module is fixed to the first upper surface through the adhesive material.

21 Claims, 16 Drawing Sheets

(56) References Cited

U.S. PATENT DOCUMENTS

2013/0183862 A1\* 7/2013 Ni ............................ H01L 24/97
   29/831
2021/0249333 A1\* 8/2021 Lewison ............... H01L 23/427
2021/0274655 A1\* 9/2021 Jin ......................... H05K 1/165

\* cited by examiner

ELECTRONIC MODULE ASSEMBLY STRUCTURE

CROSS-REFERENCE TO RELATED APPLICATION

This application claims priority to China Patent Application No. 202111331384.1, filed on Nov. 11, 2021. The entire contents of the above-mentioned patent applications are incorporated herein by reference for all purposes.

FIELD OF THE INVENTION

The present disclosure relates to a technology field of power electronic devices, and more particularly to an electronic module assembly structure for overcoming the problem of falling parts during reflow soldering of an electronic module on a system board.

BACKGROUND OF THE INVENTION

With the rapid development of switching power supply technology in various application fields, more and more power supply products are developing towards the purposes of high efficiency, high power density, high reliability and low cost. In order to further increase the power density and simplify the manufacturing process, the electronic module is often used as a component and then soldered to a system board by surface-mount soldering.

Surface-mount soldering for a conventional system board can be divided into a first tin-side reflow soldering and a second tin-side reflow soldering according to the procedure. However, due to mechanical or electrical considerations, the electronic module with larger size and weight often need to be installed on the first tin-side of the system board. When the second tin-side of the system board passes through the reflow furnace, Since the weight of the electronic module on the first tin-side is greater than the solder tension of the soldered pins, there may be a risk of falling parts. Therefore, appropriate measures need to be taken to overcome the problem of falling parts.

In order to overcome the problem that the electronic module disposed on the first tin-side of the system board is dropped during the reflow soldering process of the second tin-side of the system board, the conventional method is implemented by adjusting the parameters of the reflow furnace, such as shortening the reflow time and reducing the fan speed in the lower half of the reflow furnace, so as to reduce the heat on the first tin-side of the system board. However, this method may cause incomplete soldering and affect the reliability of the product. In addition, by using a carrier in the furnace, a protective cover at the bottom of the carrier is allowed to cover the electronic module to achieve the effect of heat insulation, but this method requires the additional carrier. The aforementioned methods may reduce the probability of falling parts to a certain extent, but still cannot completely avoid the possibility of falling parts of the electronic module during reflow soldering.

Therefore, there is a need to provide an electronic module assembly structure with a stable bonding force formed between the electronic module and the system board during the reflow soldering for avoiding the electronic module from being dropped due to the high temperature of reflow soldering, and meeting the product reliability requirements at the same time, so as to address the above issues encountered by the prior arts.

SUMMARY OF THE INVENTION

An object of the present disclosure provides an electronic module assembly structure. For the surface-mount electronic module disposed on the system board through the reflow soldering process, the height difference between the carrier and the soldering surfaces of the leading pins in the electronic module is used for pre-dispensing an adhesive material on the system board corresponding to the carrying surface of the carrier or on the carrying surface of the at least one carrier. When the leading pins and the system board are connected through the reflow soldering process, the adhesive material between the carrier and the system board is completely cured into a solid state during the reflow preheating process, the electronic module and the system board are firmly bonded, and the cured adhesive material is maintained in the stable state in the subsequent reflow soldering process at high temperature instead of being melted due to the high temperature of the reflow soldering process. Since the carrier and the leading pins on the electronic module are prefabricated, the height difference between the carrier and the leading pins can be adjusted according to the practical requirements. No additional processing is required. When the leading pins of the electronic module are in contact with the system board, the height of the carrying surface of the carrier is lower than the height of the soldering surfaces of the leading pins, and the carrying surface is not in direct contact with the system board. Therefore, there is enough space provided between the carrier and the system board for accommodating the adhesive material. The adhesive material is disposed on the carrying surface of the at least one carrier or the system board corresponding to the geometric center area of the carrier by dispensing. The electronic module is bonded to the system board, so that the soldering surfaces of the leading pins on the periphery of the adhesive material remain connected to the system board. It helps to improve the reliability of the first reflow soldering process and ensures that the problem of falling parts of the electronic module does not occur during the subsequent second reflow soldering process. Furthermore, the curing process of the adhesive material combined with the preheating process of reflow soldering not only simplifies the assembling and manufacturing process, but also improves the reliability of the entire assembly structure and reduces the cost.

Another objection of the present disclosure provides an electronic module assembly structure. The components such as a magnetic core component, a resin block and a copper block pre-bonded on the first circuit board of the electronic module can be served as a carrier to form a carrying surface lower than the soldering surfaces of the leading pins in height. Different from the leading pins arranged on the outer periphery of the electronic module, the carrier such as the magnetic core component, the resin block and the copper block provide carrying surfaces, which are closer to the geometric center of the electronic module. When the electronic module is bonded with the system board by the adhesive material between the carrier and the system board, the supporting force provided by the adhesive material is located at the geometric center area of the electronic module or the carrying surface of the at least one carrier, which can firmly support the electronic module. In that, the leading pins are firmly soldered to the system board by reflow soldering, and the excellent bonding force and heat resistance of the cured adhesive material are maintained to ensure that the electronic module will not fall off in the subsequent reflow soldering process. On the other hand, in case of that the magnetic core component is served as the carrier, the type of the magnetic core component disposed on the first circuit board can be adjusted according to the practical requirements. As the magnetic core component is further used to form an inductor or a transformer, the setting of the adhesive material is not affected. Furthermore, the main weight of the electronic module is provided by the magnetic core component. When the magnetic core component is severed as the carrier, and the adhesive material is solidified to bond the electronic module and the system board, the electronic module and the system board can be connected effectively. In addition, in conjunction with the second circuit board to form an integrated electronic module, the soldering surfaces of the leading pins further form a pad structure on the third lower surface of the second circuit board, and the carrier is at least partially arranged in the groove structure of the second circuit board. In that, it is beneficial to form a height difference between the carrier and the soldering surfaces of the leading pins, and the adhesive material is pre-dispensed on the carrying surface of the at least one carrier or the system board corresponding to the carrying surface of the carrier. When the integrated electronic module is placed on the system board for the reflow soldering process, the adhesive material is cured and firmly bonded between the electronic module and the system board, and the soldering of the leading pins and the system board is enhanced. Thus, the integrity and the reliability of the entire structure are enhanced, the assembling process is simplified and the manufacturing cost is further reduced.

In accordance with an aspect of the present disclosure, an electronic module assembly structure is provided. The electronic module assembly structure includes a system board, an electronic module and an adhesive material. The system board includes a first upper surface and a first lower surface opposite to each other. The electronic module spatially corresponds to the first upper surface of the system board, and includes a plurality of leading pins and at least one carrier. Each of the plurality of leading pins has a soldering surface and is connected to the first upper surface of the system board through a first reflow soldering process. The at least one carrier has a carrying surface. When the plurality of leading pins are connected to the first upper surface of the system board, a height difference is formed between the carrying surface of the at least one carrier and the soldering surfaces of the plurality of pins. The adhesive material is disposed on the carrying surface of the at least one carrier or the first upper surface of the system board corresponding to the carrying surface. The adhesive material connects the at least one carrier of the electronic module with the first upper surface of the system board through the adhesive material, so that the electronic module is fixed to the first upper surface of the system board through the adhesive material.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

Figure 1:
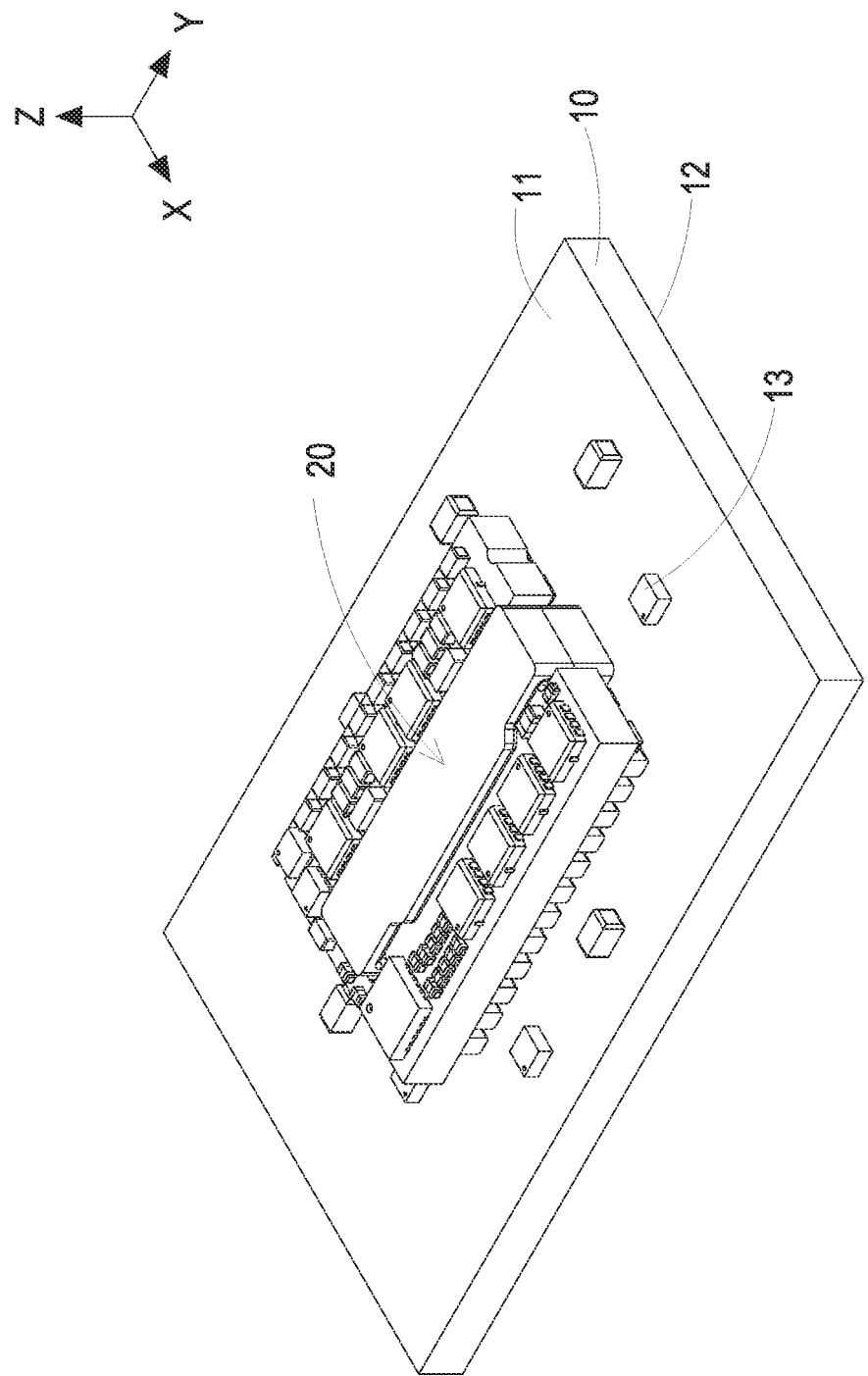
FIG. 1 is a perspective view illustrating an electronic module assembly structure according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 2:
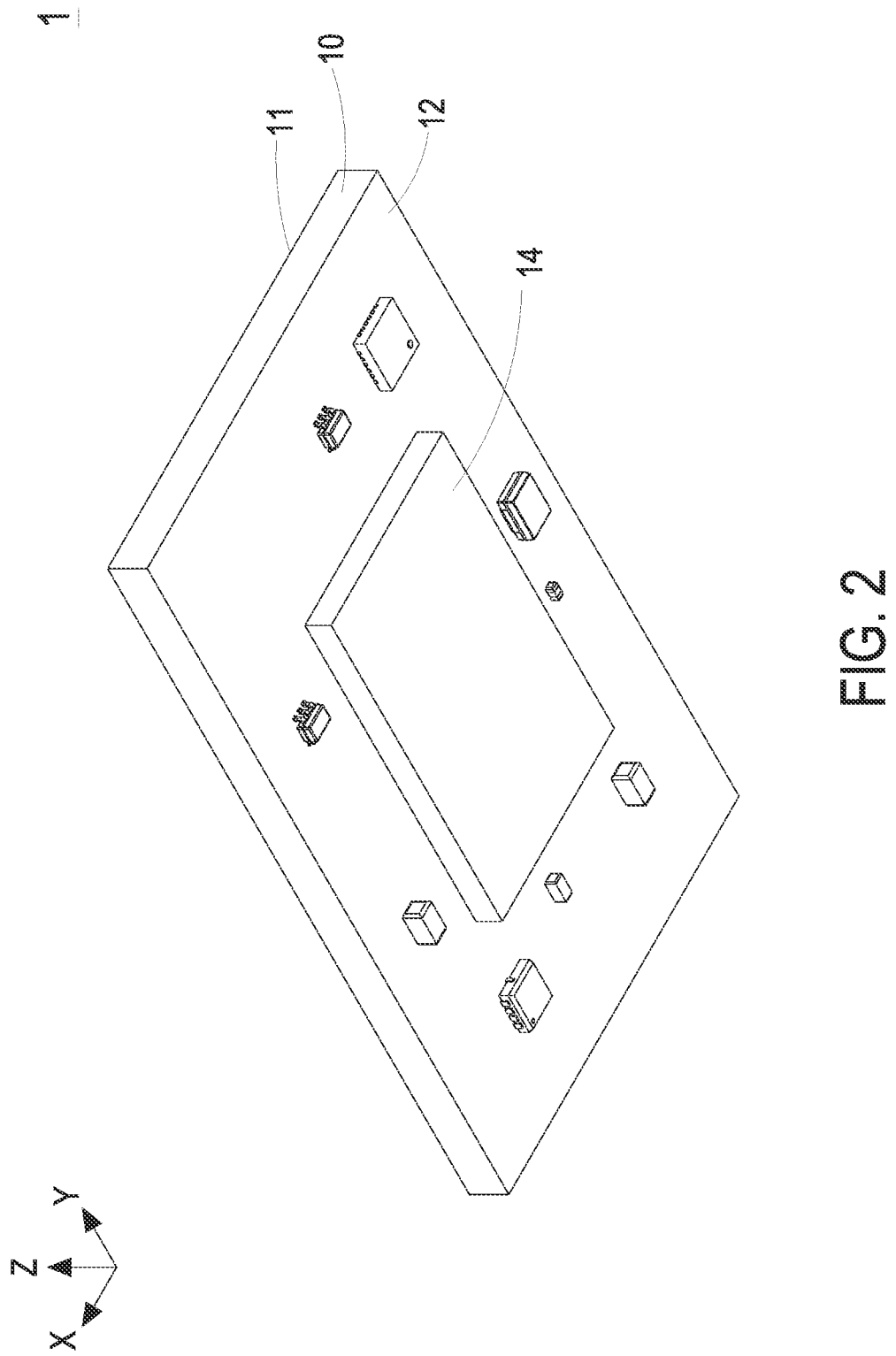
FIG. 2 is a perspective view illustrating the electronic module assembly structure according to the first embodiment of the present disclosure and taken from another perspective.
Figure 3:
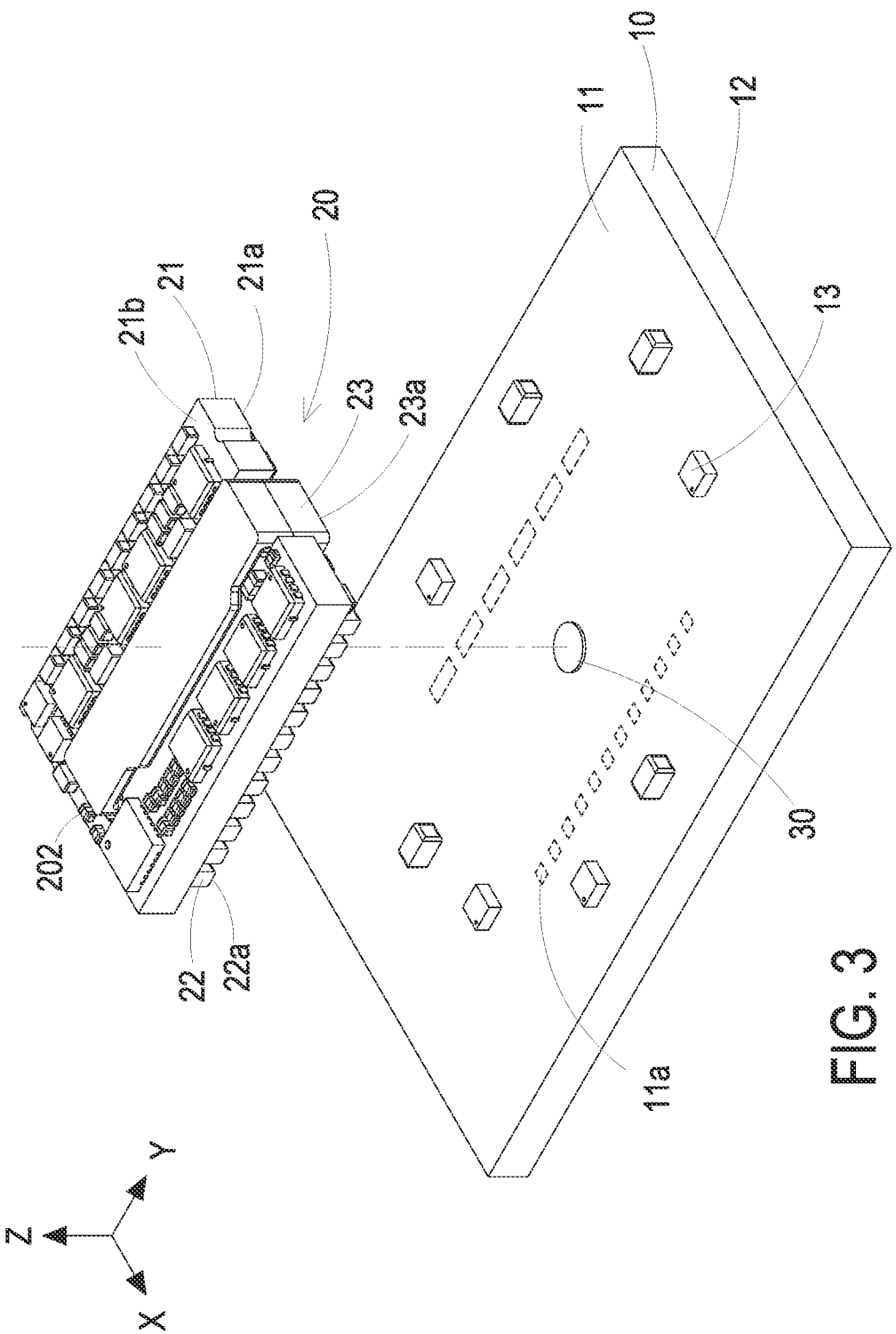
FIG. 3 is an exploded view illustrating the electronic module assembly structure according to the first embodiment of the present disclosure.
Figure 4:
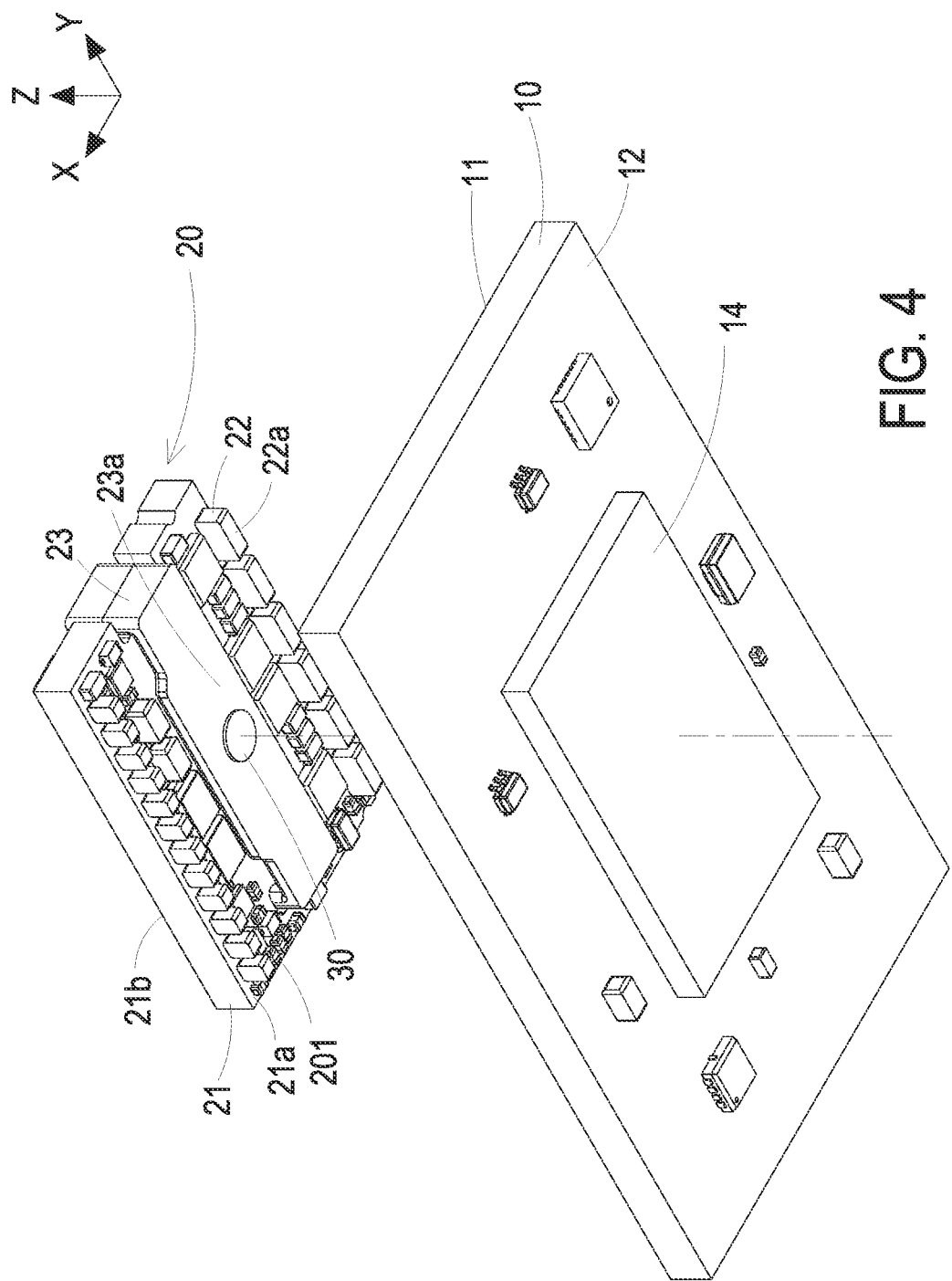
FIG. 4 is an exploded view illustrating the electronic module assembly structure according to the first embodiment of the present disclosure and taken from another perspective.
Figure 5:
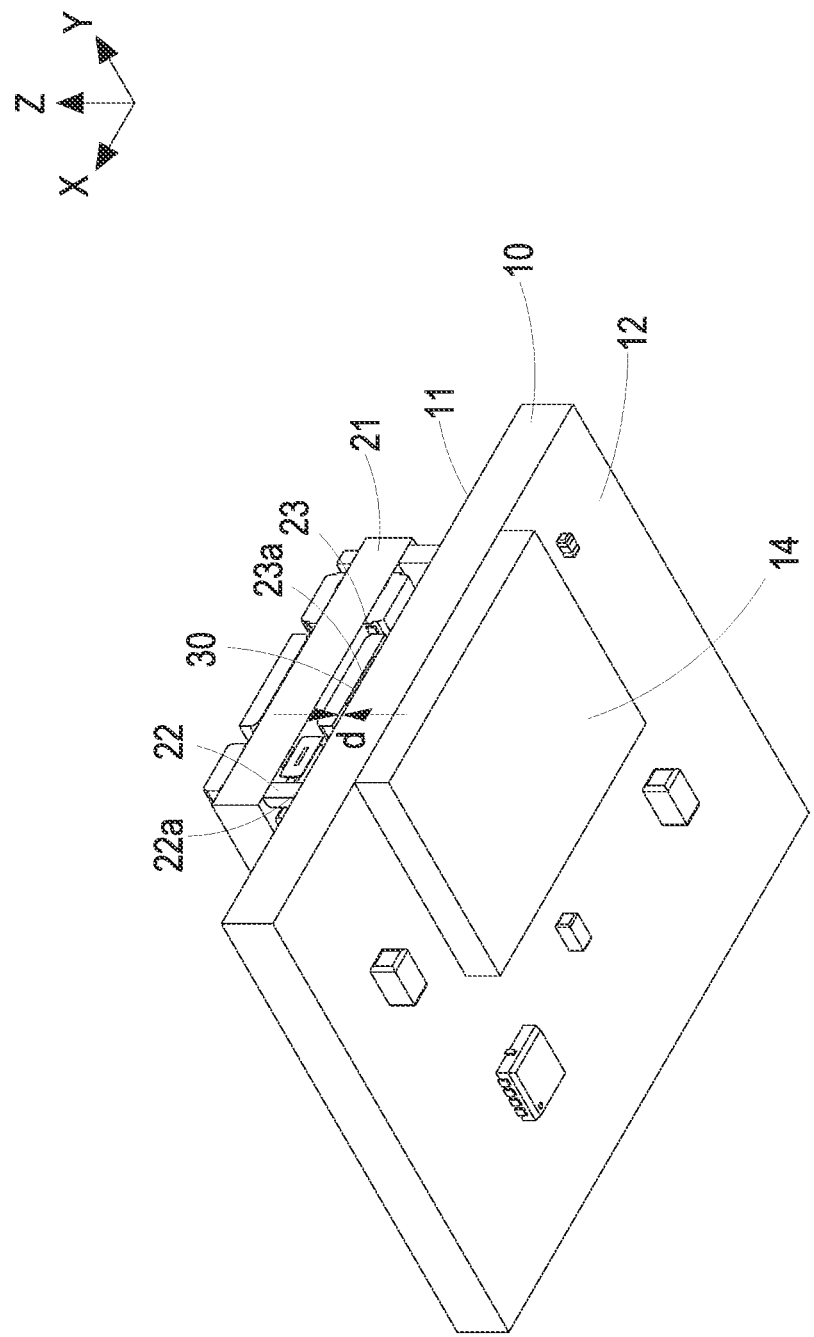
FIG. 5 is a cross-sectional structural view illustrating the electronic module assembly structure according to the first embodiment of the present disclosure.
Figure 6:
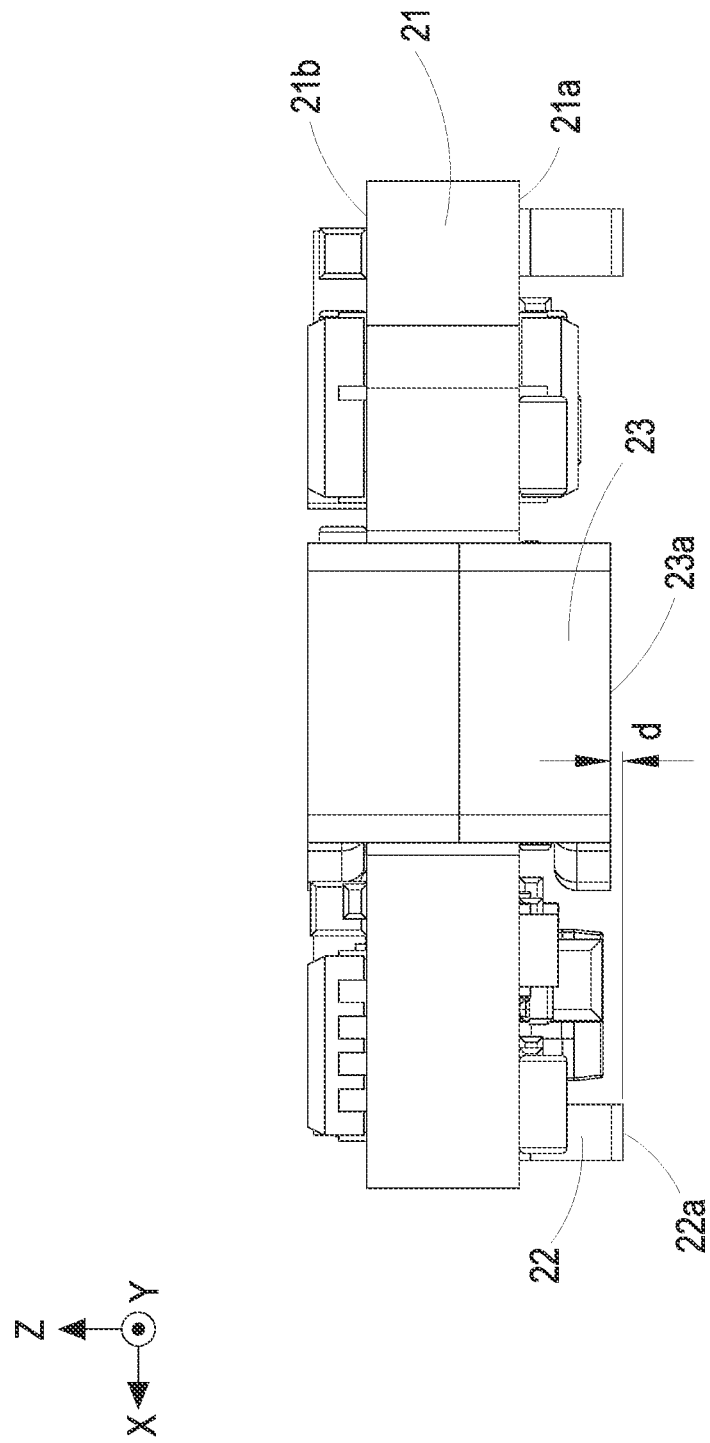
FIG. 6 is a lateral view illustrating the electronic module according to the first embodiment of the present disclosure.

FIG. 1 and FIG. 2 are perspective views illustrating an electronic module assembly structure according to a first embodiment of the present disclosure. FIG. 3 and FIG. 4 are exploded views illustrating the electronic module assembly structure according to the first embodiment of the present disclosure. FIG. 5 is a cross-sectional structural view illustrating the electronic module assembly structure according to the first embodiment of the present disclosure. FIG. 6 is a lateral view illustrating the electronic module according to the first embodiment of the present disclosure. In the embodiment, the electronic module assembly structure 1 includes a system board 10, an electronic module 20 and an adhesive material 30. Preferably but not exclusively, the electronic module 20 is a surface mount module and disposed on the system board 10 together with other surface mount devices through a reflow soldering process. The system board 10 includes a first upper surface 11 and a first lower surface 12 opposite to each other. By printing solder paste on the first upper surface 11 and the first lower surface 12, a first tin-side and a second tin-side on the system board 10 are formed and combined with a first reflow soldering process and a second reflow soldering process, respectively, so that the surface mount devices are soldered to the system board 10. In the embodiment, in addition to the electronic module 20, the system board 10 further includes for example but not limited to a plurality of first electronic devices 13, which are disposed on the first upper surface 11 through the first reflow soldering process. Similarly, the system board 10 further includes a plurality of second electronic devices 14, for example large-scale devices such as Ball Grid Array (BGA) packages, which are not suitable to being simultaneously arranged on the first upper surface 11 of the system board 10 with the electronic modules 20. Therefore, the plurality of second electronic devices 14 are disposed on the first lower surface 12 through the second reflow soldering process. The present disclosure is not limited to the number and the order of the reflow soldering processes for mounting the surface mount devices or the surface mount modules on the system board 10.

Preferably but not exclusively, in the embodiment, the electronic module 20 a power conversion module, which has a larger size and a larger weight than a general surface mount device. It should be noted that the electronic module 20 of the electronic module assembly structure 1 in the present disclosure spatially corresponds to the first upper surface 11 of the system board 10, but the present disclosure is not limited thereto. In the embodiment, before the electronic module 20 is disposed on the system board 10 through the first reflow soldering process, the electronic module 20 includes a plurality of leading pins 22 and at least one carrier pre-disposed thereon. Preferably but not exclusively, the carrier is a magnetic core component 23 having a carrying surface 23a. Each of the plurality of leading pins 22 has a soldering surface 22a, respectively, and the soldering surfaces 22a of the plurality of leading pins 22 have the same or approximately the same level with each other. Moreover, each of the plurality of leading pins 22 is connected to the first upper surface 11 of the system board 10 through the first reflow soldering process, so as to electrically connect to the corresponding pad 11a on the first upper surface 11. Preferably but not exclusively, the plurality of leading pins 22 are arranged around the outer periphery of the carrier. In the embodiment, the height of the carrying surface 23a of the magnetic core component 23 served as a carrier relative to the second lower surface 21a of the first circuit board 21 and the height of the soldering surfaces 22a of the plurality of leading pins 22 relative to the second lower surface 21a of the first circuit board 21 form a height difference d in the Z axial direction, and the height difference is ranged from 0.1 mm to 2 mm. Therefore, when the soldering surfaces 22a are attached to the first upper surface 11, the carrying surface 23a is not in direct contact with the first upper surface 11. In the embodiment, the adhesive material 30 is disposed on the carrying surface 23a of the at least one carrier or the first upper surface 11 of the system board 10 corresponding to the carrying surface 23a. Preferably but not exclusively, the adhesive material 30 connects the carrier of the electronic module 20 and the first upper surface 11 of the system board 10, so that the electronic module 20 is fixed to the first upper surface 11 of the system board 10 through the adhesive material 30.

Notably, in the embodiment, the adhesive material 30 is made of a thermosetting plastic, and the adhesive material 30 is pre-disposed on the system board 10 corresponding to a geometric center area of the carrying surface 23a by dispensing. The adhesive material 30 is cured in the preheating process of the reflow soldering process to bond the electronic module 20 and the system board 10. In other embodiments, the solder paste is printed on the pads 11a on the first upper surface 11 of the system board 10, and then the plurality of first electronic devices 13 and the electronic module 20 with the adhesive material 30 dispensing on the carrying surface are placed on the first upper surface 11 of the system board 10. When the first reflow soldering process is performed, the adhesive material 30 is completely cured into a solid state during the reflow preheating process, and the electronic module 20 and the system board 10 are firmly bonded. Furthermore, the electronic module 20 and the plurality of first electronic devices 13 are fixed to the first upper surface 11 of the system board 10 after the reflow soldering process at high temperature. In the embodiment, the excellent bonding force and heat resistance of the cured adhesive material 30 are maintained, and the cured adhesive material 30 is not easily deteriorated even through the subsequent reflow soldering process at high temperature. It helps to improve the reliability of the reflow soldering process. Moreover, when the system board 10 is inverted to perform the second reflow soldering process on the first lower surface 12, the adhesive material 30 is still maintained in a stable state, and not melted due to the high temperature of reflow soldering. It ensures that the electronic module 20 will not fall off in the subsequent second reflow soldering process.

In the embodiment, the electronic module 20 is prefabricated and includes a first circuit board 21 having a second lower surface 21a and a second upper surface 21b opposite to each other. The second lower surface 21a is disposed adjacent to the first upper surface 11 of the system board 10. In the embodiment, the magnetic core component 23 served as a carrier is disposed on the second lower surface 21a and the second upper surface 21b of the first circuit board 21 by bonding or welding. In other embodiments, the magnetic core component 23 is only disposed on the second lower surface 21a of the first circuit board 21, and the carrying surface 23a is disposed on the top surface of the magnetic core component 23, so as to spatially correspond to the first upper surface 11 of the system board 10. Notably, in case of that the magnetic core component 23 is served as a carrier, the type of the magnetic core component 23 disposed on the first circuit board 21 is adjustable according to the practical requirements. As the magnetic core component 23 is further used to form the structure of an inductor or a transformer, the setting of the adhesive material 30 is not affected. Furthermore, the main weight of the electronic module 20 is provided by the magnetic core component 23. When the magnetic core component 23 is severed as the carrier, and the adhesive material 30 is solidified to bond the electronic module 20 and the system board 10, the electronic module 20 and the system board 10 can be connected effectively. Certainly, the present disclosure is not limited thereto. Preferably but not exclusively, in the embodiment, each of the plurality of leading pins 22 is formed of a copper bar, and the copper bar is pre-set on the second lower surface 21a of the first circuit board 21 by welding. The height of the soldering surfaces 22a of the leading pins 22 relative to the second lower surface 21a of the first circuit board 21 is greater than the height of the carrying surface 23a relative to the second lower surface 21a of the first circuit board 21, and the height difference d is formed between the two heights. Preferably but not exclusively, the height difference d is ranged from 0.1 mm to 2 mm. In the embodiment, the electronic module 20 further includes at least one electronic component 201 pre-set on the second lower surface 21a of the first circuit board 21, and at least one electronic component 202 pre-set on the second upper surface 21b of the first circuit board 21. In other embodiments, the quantity, the type and the arrangement of the at least one electronic component 201 and the at least one electronic component 202 are adjustable or omitted according to the practical requirements. Certainly, the present disclosure is not limited thereto, and not redundantly described herein.

Figure 7:
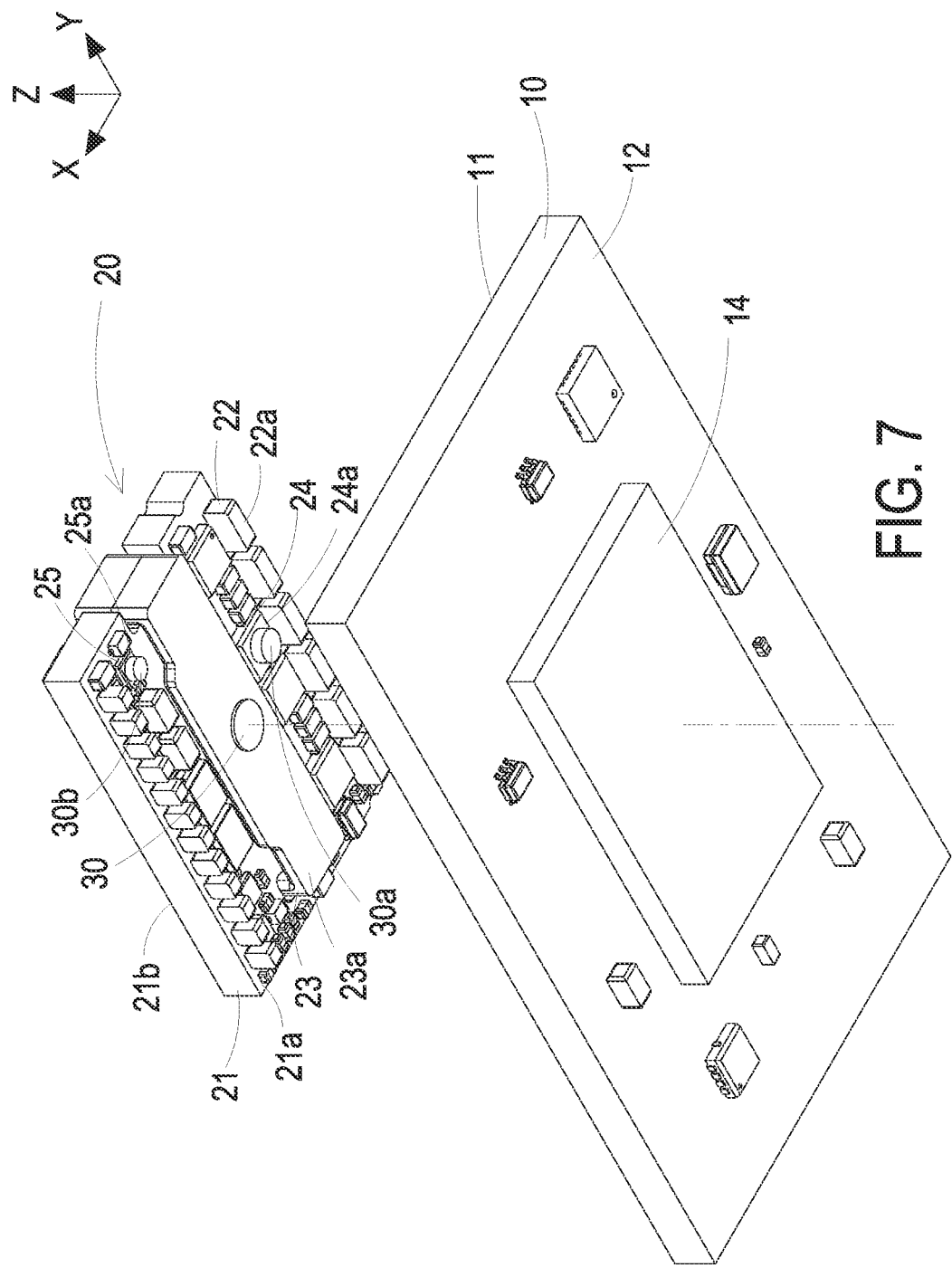
FIG. 7 is an exploded view illustrating an electronic module assembly structure according to a second embodiment of the present disclosure.

FIG. 7 is an exploded view illustrating an electronic module assembly structure according to a second embodiment of the present disclosure. In the embodiment, the electronic module assembly structure 1a is similar to the electronic module assembly structure 1 shown in FIGS. 1 to 5, and the same labels of the components represent the same components, structures and functions, not redundantly described herein. In the embodiment, the electronic module 20 is prefabricated and includes a magnetic core component 23, a resin block 24 and a copper block 25, which are disposed on the second lower surface 21a of the first circuit board 21 and spatially corresponding to the first upper surface 11 of the system board 10. When the soldering surfaces 22a of the leading pins 22 are in contact with the first upper surface 11 of the system board 10, the height differences of the magnetic core component 23, the resin block 24 and the copper block 25 relative to the soldering surfaces 22a of the leading pins 22 are used to pre-dispense the adhesive materials 30, 30a, 30b on the system boards corresponding to the carrying surfaces 23a, 24a, 25a, respectively or used to pre-dispense the adhesive materials 30, 30a, 30b on the carrying surfaces 23a, 24a, 25a, respectively. In other words, with respect to the soldering surfaces 22a of the leading pins 22 of the electronic module 20 for reflow soldering, the objects such as the magnetic core component 23, the resin block 24 and the copper block 25 that are pre-bonded on the first circuit board 21 of the electronic module 20 can be used as the carriers to form the carrying surfaces 23a, 24a, 25a. In that, the carrying surfaces 23a, 24a, 25a have relative heights lower than the soldering surfaces 22a of the leading pins 22 in the Z axial direction, and arranged corresponding to the positions, such as, the positions of the adhesive materials 30, 30a, 30b on the system board 10. Different from the leading pins 22 arranged on the outer periphery of the electronic module 20, the magnetic core component 23 served as the carrier provides the carrying surface 23a, the resin block 24 served as the carrier provides the carrying surface 24a, and the copper block 25 served as the carrier provides the carrying surface 25a, which are closer to a geometric center of the electronic module 20. When the electronic module 20 is bonded with the system board 10 by the adhesive materials 30, 30a, 30b between the carriers and the system board 10, the supporting force provided by the adhesive materials 30, 30a, 30b is located at the geometric center area of the electronic module 20, so as to firmly support the electronic module 20. In that, the leading pins 22 are firmly soldered to the system board 10 by reflow soldering, and the excellent bonding force and heat resistance of the cured adhesive materials 30, 30a, 30b are maintained to ensure that the electronic module 20 will not fall off in the subsequent reflow soldering process. In the embodiment, the carrying surface 23a provided by the magnetic core component 23 served as the carrier, the carrying surface 24a provided by the resin block 24 served as the carrier, and the carrying surface 25a provided by the copper block severed as the carrier can form different height differences relative to the soldering surfaces 22a of the leading pins 22. The dimensions of the adhesive materials 30, 30a, 30b can also be adjusted according to the practical requirements. Moreover, in other embodiments, any one of the adhesive materials 30, 30a, 30b is omitted, or the size and the quantity are adjusted according to the practical requirements. The carrier may include at least one of a magnetic core component 23, a resin block 24 and a copper block 25, and the carrier is disposed in the electronic module 20 by welding, bonding or other fixing methods. Certainly, the present disclosure is not limited thereto.

Figure 8:
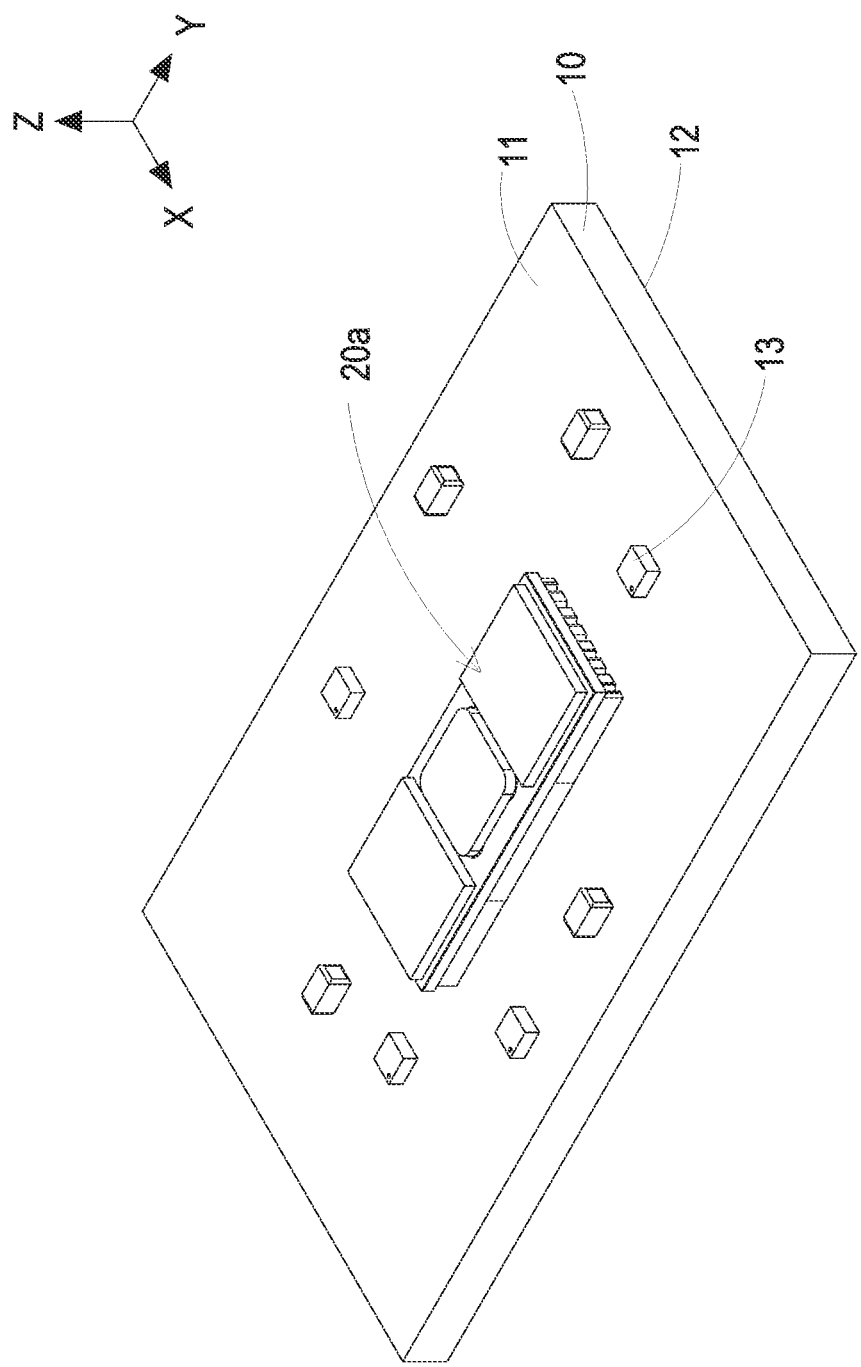
FIG. 8 is a perspective view illustrating an electronic module assembly structure according to a third embodiment of the present disclosure.
Figure 9:
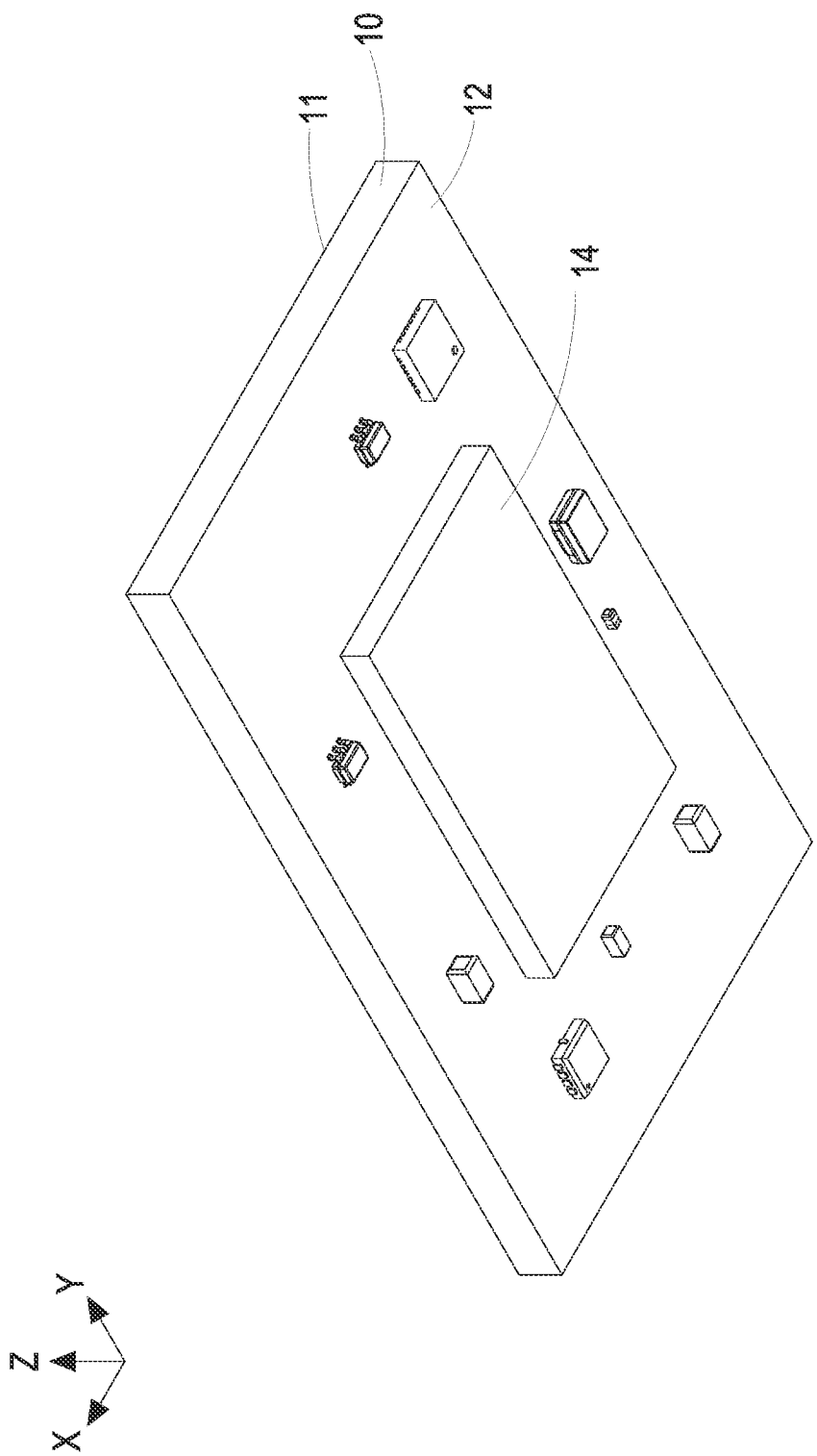
FIG. 9 is a perspective view illustrating the electronic module assembly structure according to the third embodiment of the present disclosure and taken from another perspective.
Figure 10:
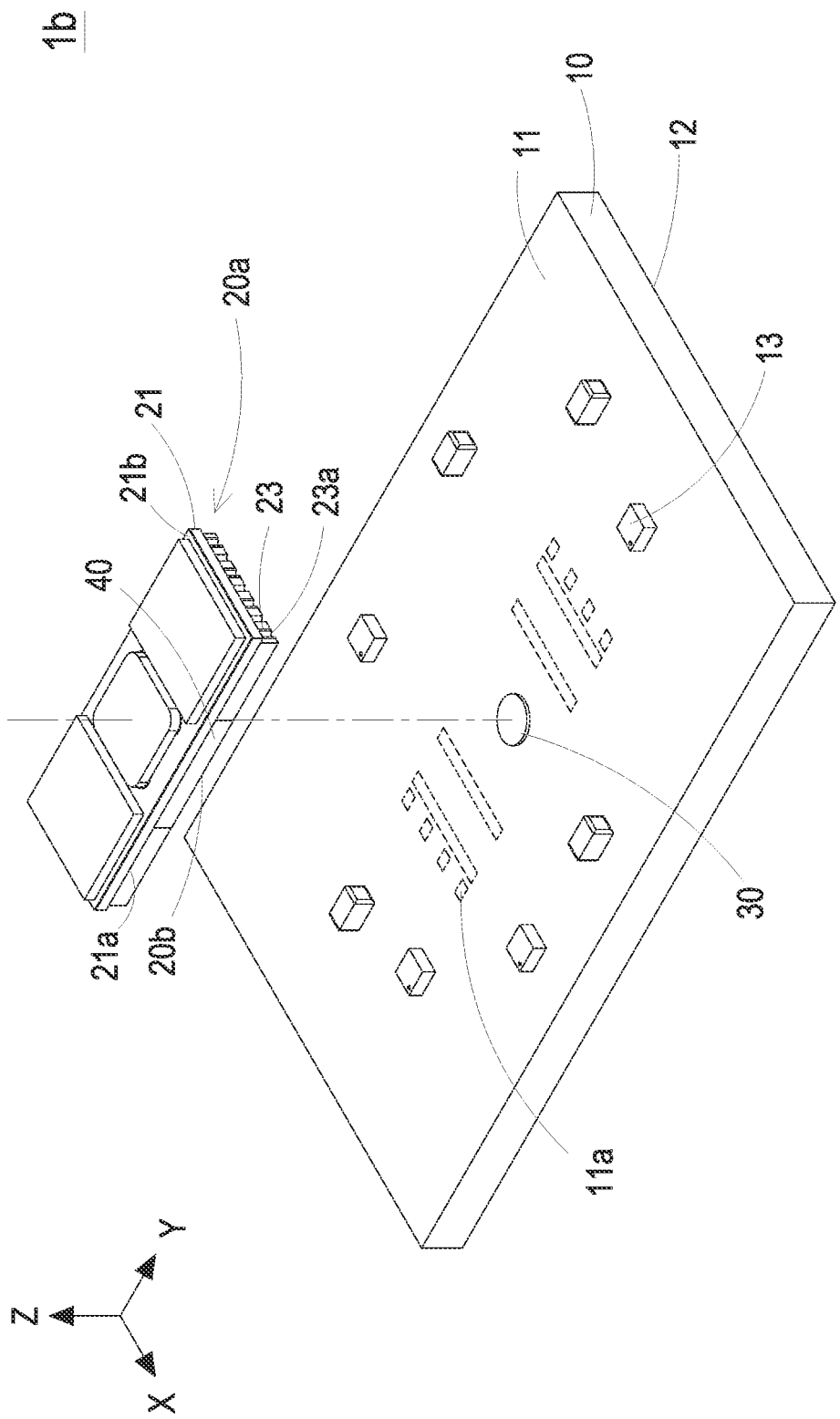
FIG. 10 is an exploded view illustrating the electronic module assembly structure according to the third embodiment of the present disclosure.
Figure 11:
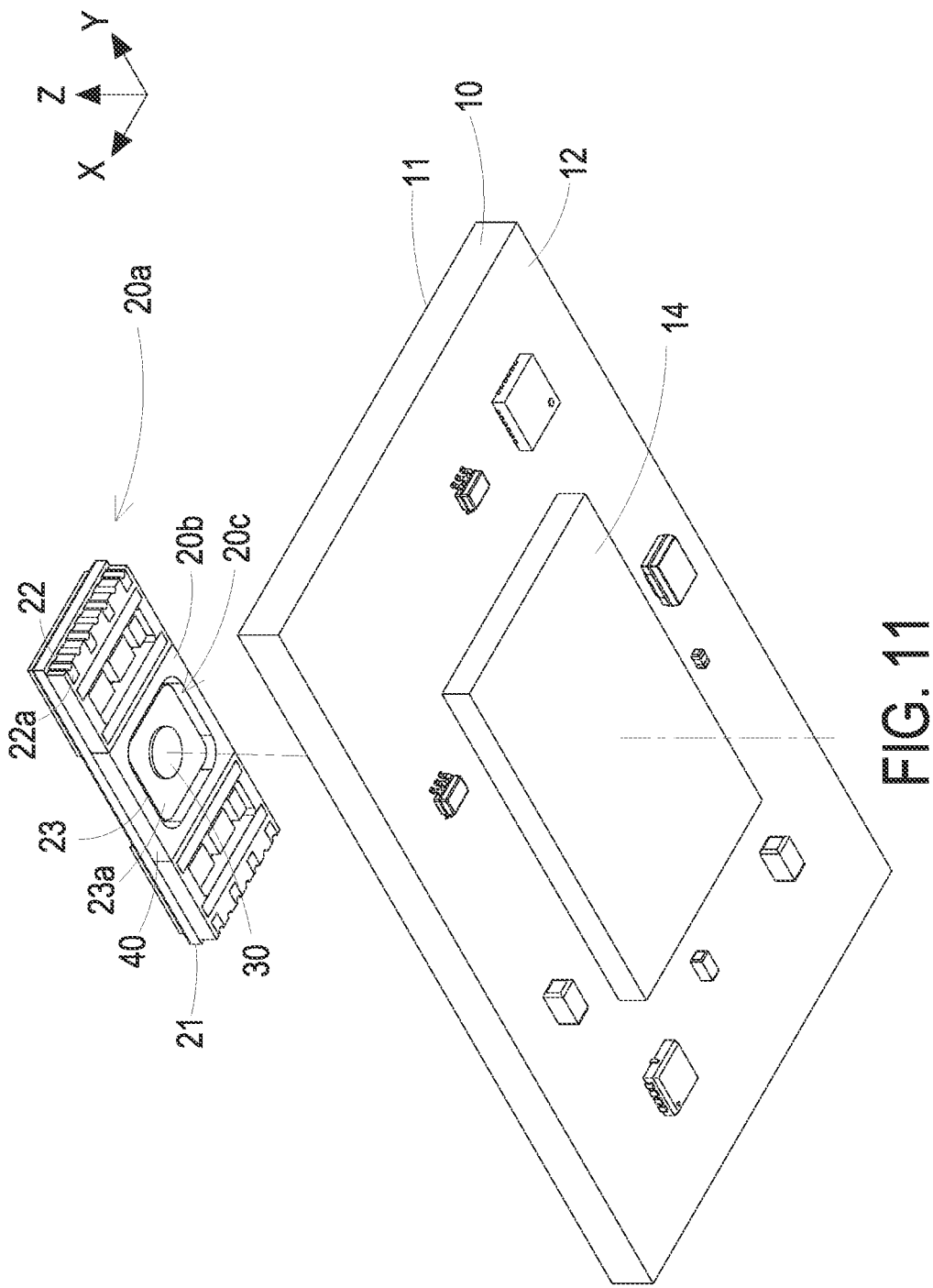
FIG. 11 is an exploded view illustrating the electronic module assembly structure according to the third embodiment of the present disclosure and taken from another perspective.
Figure 12:
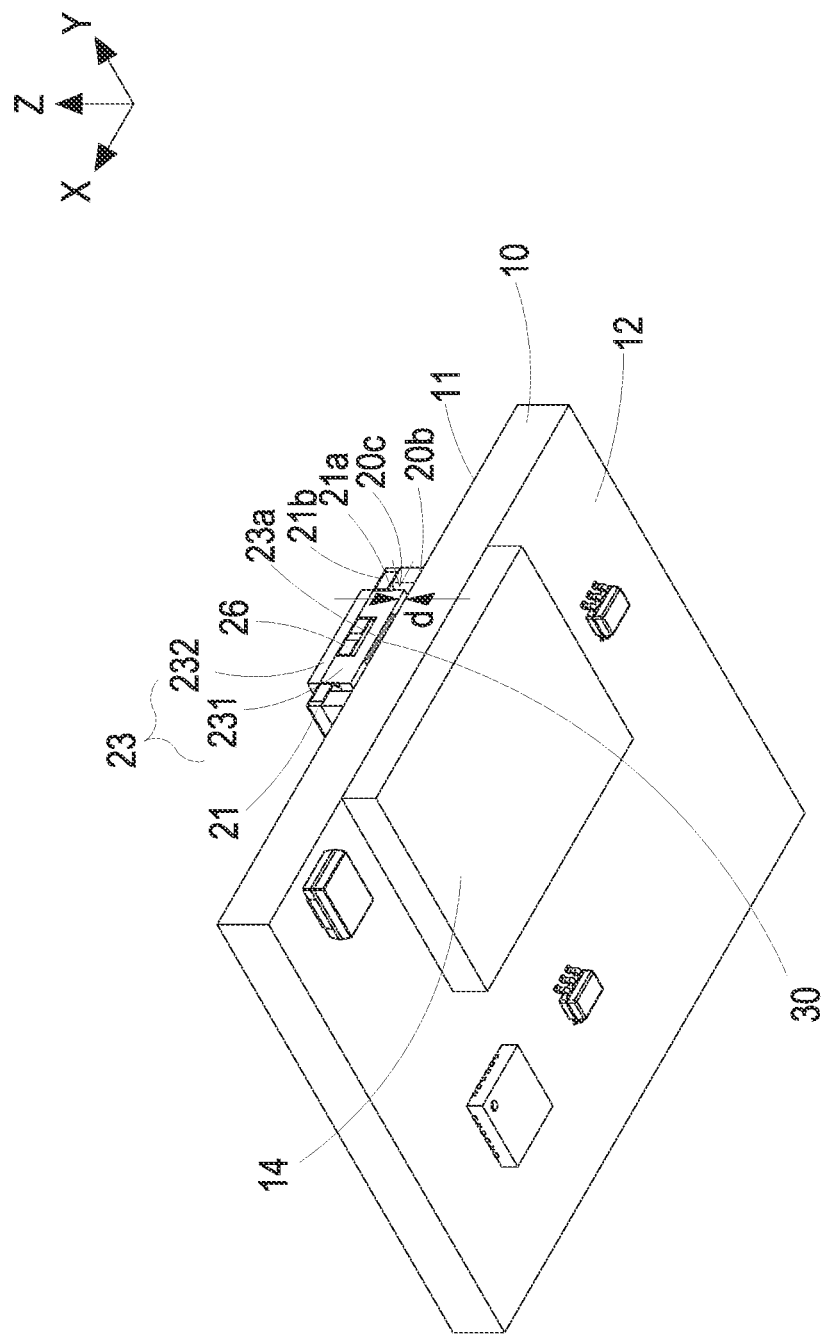
FIG. 12 is a cross-sectional structural view illustrating the electronic module assembly structure according to the third embodiment of the present disclosure.
Figure 13:
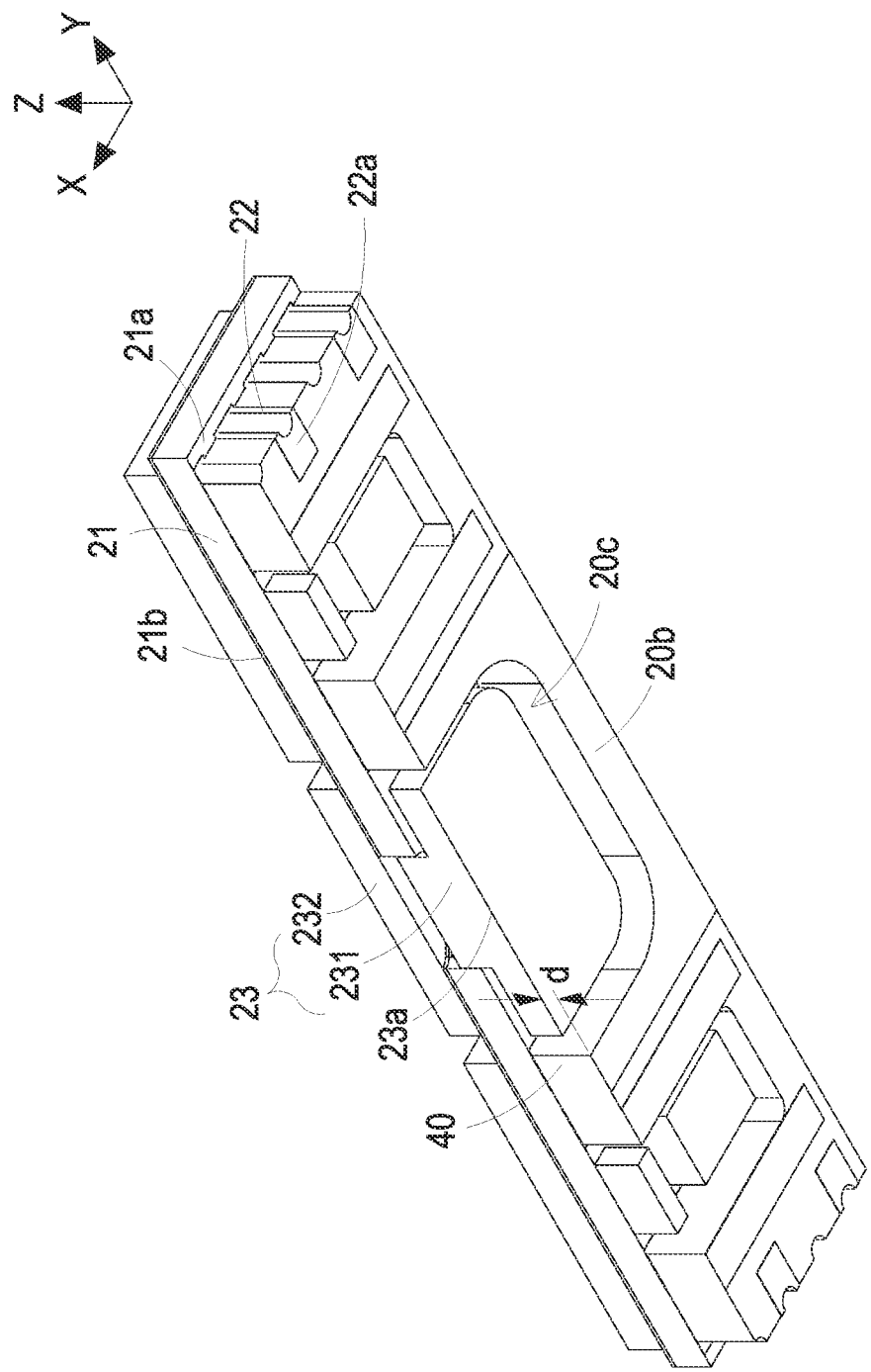
FIG. 13 is a cross-sectional structural view illustrating the electronic module according to the third embodiment of the present disclosure.

FIG. 8 and FIG. 9 are a perspective views illustrating an electronic module assembly structure according to a third embodiment of the present disclosure. FIG. 10 and FIG. 11 are exploded views illustrating the electronic module assembly structure according to the third embodiment of the present disclosure. FIG. 12 is a cross-sectional structural view illustrating the electronic module assembly structure according to the third embodiment of the present disclosure. FIG. 13 is a cross-sectional structural view illustrating the electronic module according to the third embodiment of the present disclosure. In the embodiment, the electronic module assembly structure 1b and the electronic module 20a are similar to the electronic module assembly structure 1 and the electronic module 20 shown in FIGS. 1 to 6, and the same labels of the components represent the same components, structures and functions, not redundantly described herein. Compared with the first embodiment of the present disclosure, in the embodiment, the electronic module assembly structure 1b further includes an integrated electronic module 20a. The electronic module 20a further includes a second circuit board 40 having a third upper surface and a third lower surface 20b opposite to each other. In the embodiment, the third upper surface of the second circuit board 40 and the second lower surface 21a of the first circuit board 21 are connected by welding. In the embodiment, the second circuit board 40 further includes a groove structure 20c, and the magnetic core component 23 served as the carrier is at least partially disposed within the groove structure 20c correspondingly. Preferably but not exclusively, the plurality of leading pins 22 are sidewall semi-through-hole structures, and exposed on the third lower surface 20b and the sidewalls of the second circuit board 40 to facilitate the electronic module 20a to be fixed and electrically connected. The soldering surfaces 22a of the plurality of leading pins 22 are exposed on the third lower surface 20b to form a pad structure. The present disclosure is not limited thereto. In some embodiments, the magnetic core component 23 served as the carrier includes a first magnetic core 231 and a second magnetic core 232, which are disposed on the third lower surface 20b of the second circuit board 40 and the second upper surface 21b of the first circuit board 21, respectively. The magnetic core component 23 partially passes through the second circuit board 40. The first magnetic core 231 and the second magnetic core 232 of the magnetic core component 23 are connect with each other. The carrying surface 23a is disposed on the top surface of the first magnetic core 231. In the embodiment, the electronic module 20a further includes a conductor 26, which is wound around the magnetic core component 23. Preferably but not exclusively, the conductor 26 is configured to form a winding and embedded in the first circuit board 21, so that the conductor 26 and the magnetic core component 23 are constructed together to form an inductor or a transformer. In other embodiments, the conductor 26 is an external winding, which is soldered to the first circuit board 21 to form an inductor or a transformer with the magnetic core component 23. Certainly, the present disclosure is not limited thereto. In the embodiment, the magnetic core component 23 served as the carrier is located at the geometric center area of the first circuit board 21. In the integrated electronic module 20a, the soldering surfaces 22a of the leading pins 22 collaboratively form a pad structure on the third lower surface 20b of the electronic module 20a, and the magnetic core component 23 served as the carrier is at least partially disposed in the groove structure 20c of the second circuit board 40. Moreover, the carrying surface 23a provided by the magnetic core component 23 served as the carrier and the soldering surfaces 22a of the leading pins 22 form a height difference in the Z axial direction. In the embodiment, the height of the carrying surface 23a of the magnetic core component 23 served as the carrier disposed on the second lower surface 21a of the first circuit board 21 is lower than the height of the soldering surfaces 22a of the plurality of leading pins 22 disposed on the second lower surface 21a of the first circuit board 21. Therefore, there is a height difference d formed between the carrying surface 23a and the soldering surfaces 22a. Preferably but not exclusively, the height difference d is ranged from 0.1 mm to 2 mm, so that there is enough space provided for pre-dispensing the adhesive material 30. When the integrated electronic module 20a is placed on the first upper surface 11 of the system board 10 for the first reflow soldering process, the adhesive material 30 is cured and firmly bonded to the electronic module 20a and the system board 10. At the same time, the soldering of the leading pins 22 and the system board 10 is enhanced, the integrity and the reliability of the entire structure is enhanced, the assembling process is simplified, and the manufacturing cost is reduced. In addition to facilitating the assembly of the magnetic core component 23, the overflow of the adhesive material 30 due to the glue-dispensing operation is avoided. Certainly, the present disclosure is not limited thereto.

Figure 14:
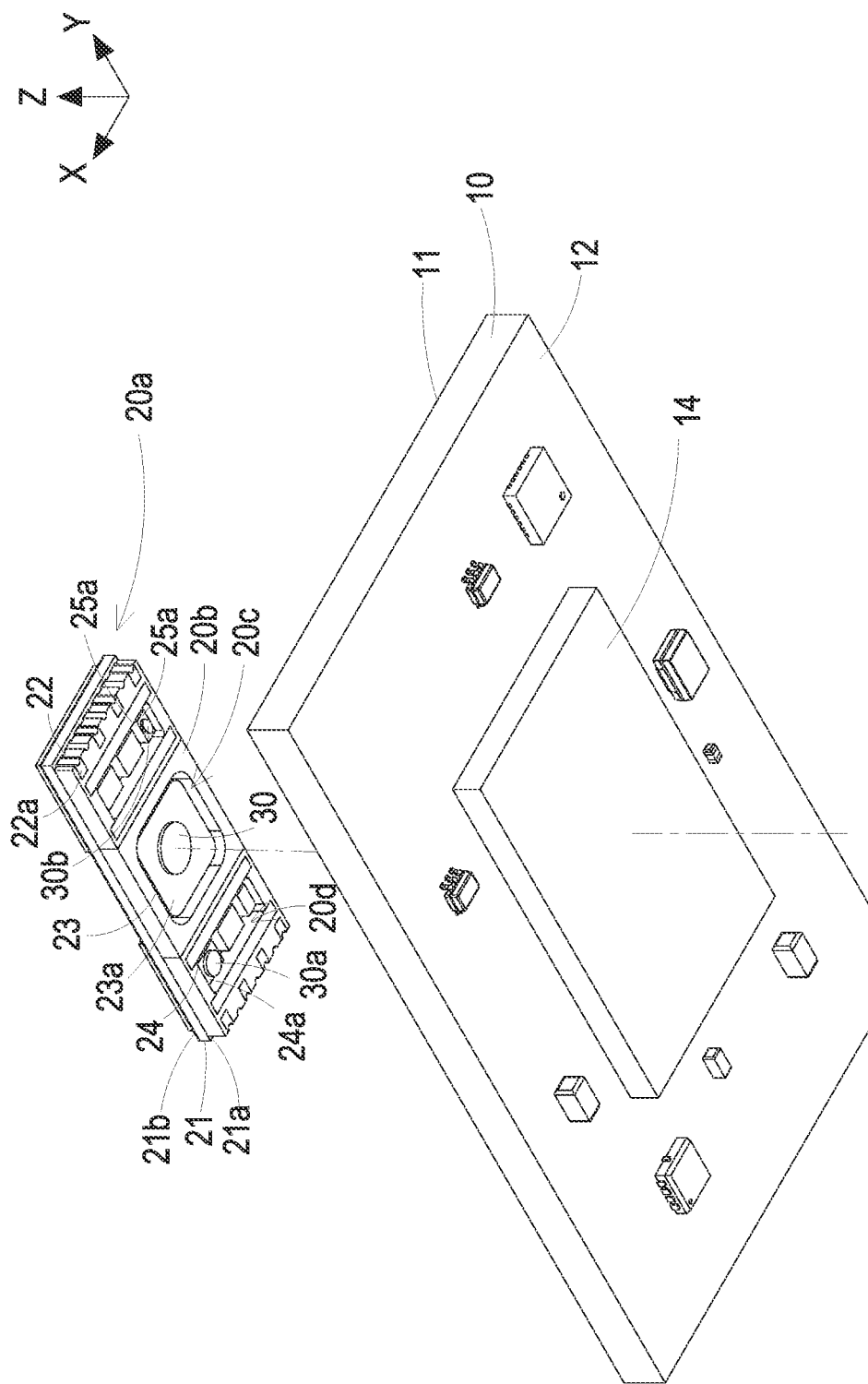
FIG. 14 is an exploded view illustrating an electronic module assembly structure according to a fourth embodiment of the present disclosure.

FIG. 14 is an exploded view illustrating an electronic module assembly structure according to a fourth embodiment of the present disclosure. In the embodiment, the electronic module assembly structure 1c is similar to the electronic module assembly structure 1b shown in FIGS. 8 to 13, and the same labels of the components represent the same components, structures and functions, not redundantly described herein. In the embodiment, the electronic module 20a is prefabricated and has the third upper surface of the second circuit board 40 and the second lower surface 21a of the first circuit board 21 connected with each other by welding, so as to form an integrated surface mount module. The electronic module 20a includes a groove structure 20c located at a geometric center area thereof and configured to accommodate at least part of the magnetic core component 23. Moreover, the electronic module 20a further includes a groove structure 20d located nearby the inner side of the leading pins 22, and configured to accommodate the resin block 24 and the copper block 25. In the embodiment, the height of the resin block 24 and the copper block 25 relative to the second lower surface 21a of the first circuit board 21 is lower than the height of the soldering surfaces 22a of the leading pins 22 relative to the second lower surface 21a of the first circuit board 21. Therefore, the carrying surface 23a of the magnetic core component 23 served as the carrier is connected to the system board 10 through the adhesive material 30, the carrying surface 24a of the resin block 24 served as the carrier is connected to the system board 10 through the adhesive material 30a, and the carrying surface 25a of the copper block 25 served as the carrier is connected to the system board 10 through the adhesive material 30b at the same time. When the soldering surfaces 22a of the leading pins 22 are in contact with the first upper surface 11 of the system board 10, the height differences of the magnetic core component 23, the resin block 24 and the copper block 25 relative to the soldering surfaces 22a of the pin 22 are used to, such as, pre-dispense the adhesive materials 30, 30a, 30b on the system boards corresponding to the carrying surfaces 23a, 24a, 25a, respectively. Different from the leading pins 22 arranged on the outer periphery of the electronic module 20a, the carrying surfaces of the carriers such as the carrying surface 23a provided by the magnetic core component 23, the carrying surface 24a provided by the resin block 24, and the carrying surface 25a provided by the copper block 25 are closer to the geometric center of the electronic module 20a. When the electronic module 20a is bonded with the system board 10 by the adhesive materials 30, 30a, 30b, the supporting force provided by the adhesive materials 30, 30a, 30b is located at the geometric center area of the electronic module 20a, so as to firmly support the electronic module 20a. In that, the leading pins 22 are firmly soldered to the system board 10 by reflow soldering, and the excellent bonding force and heat resistance of the cured adhesive materials 30, 30a, 30b are maintained to ensure that the electronic module 20a will not fall off in the subsequent reflow soldering process. On the other hand, the groove structure 20c and the groove structure 20d of the second circuit board 40 are more helpful to avoid the overflow of adhesive materials 30, 30a, 30b due to the glue-dispensing operation when the adhesive materials 30, 30a, 30b are dispensed. In other embodiments, any one of the adhesive materials 30, 30a, 30b is omitted, or the size and the quantity are adjusted according to the according to the practical requirements, so as to meet the bonding requirements in different application environments. The present disclosure is not limited thereto, and not redundantly described herein.

Figure 15:
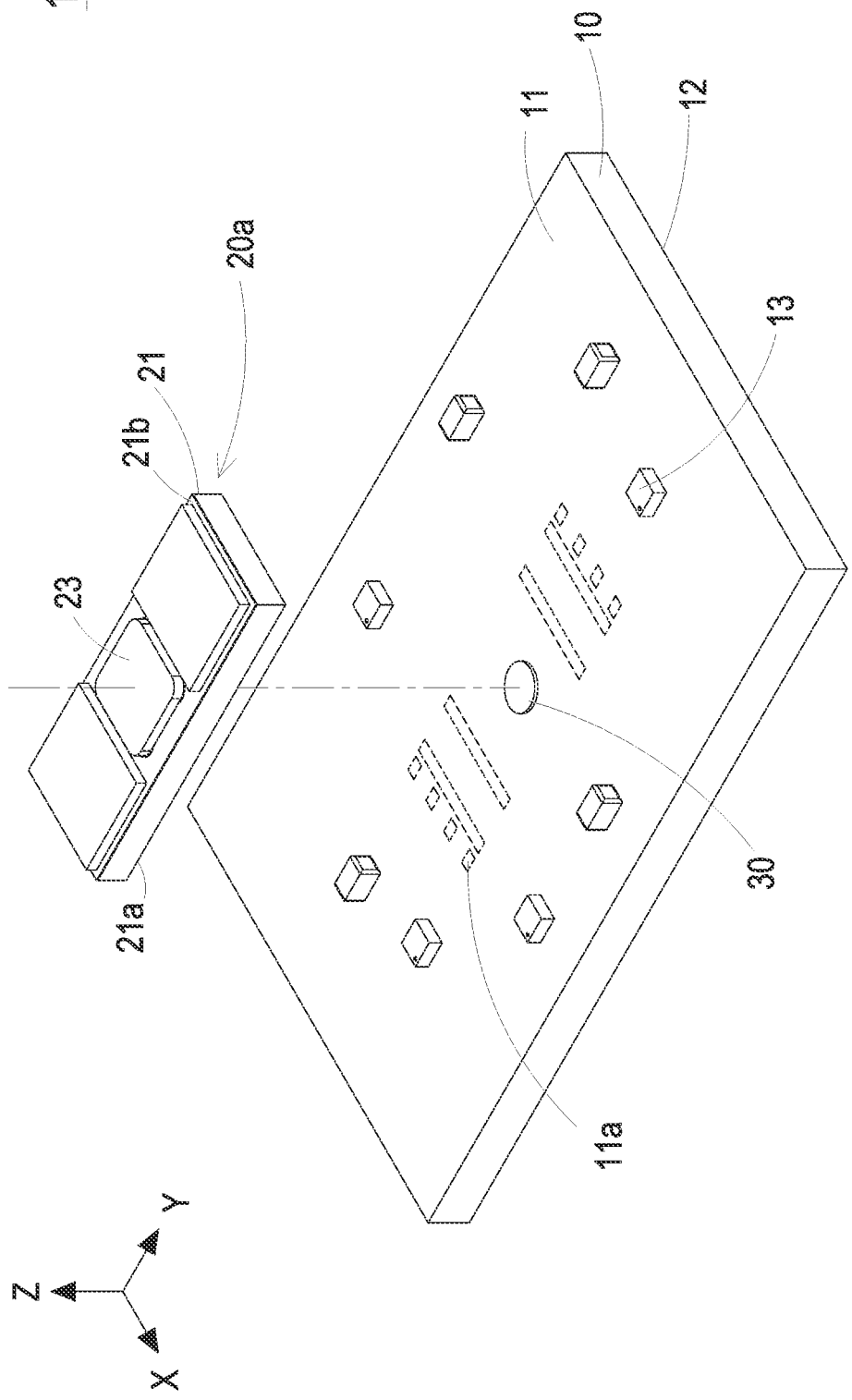
FIG. 15 is an exploded view illustrating an electronic module assembly structure according to a fifth embodiment of the present disclosure.
Figure 16:
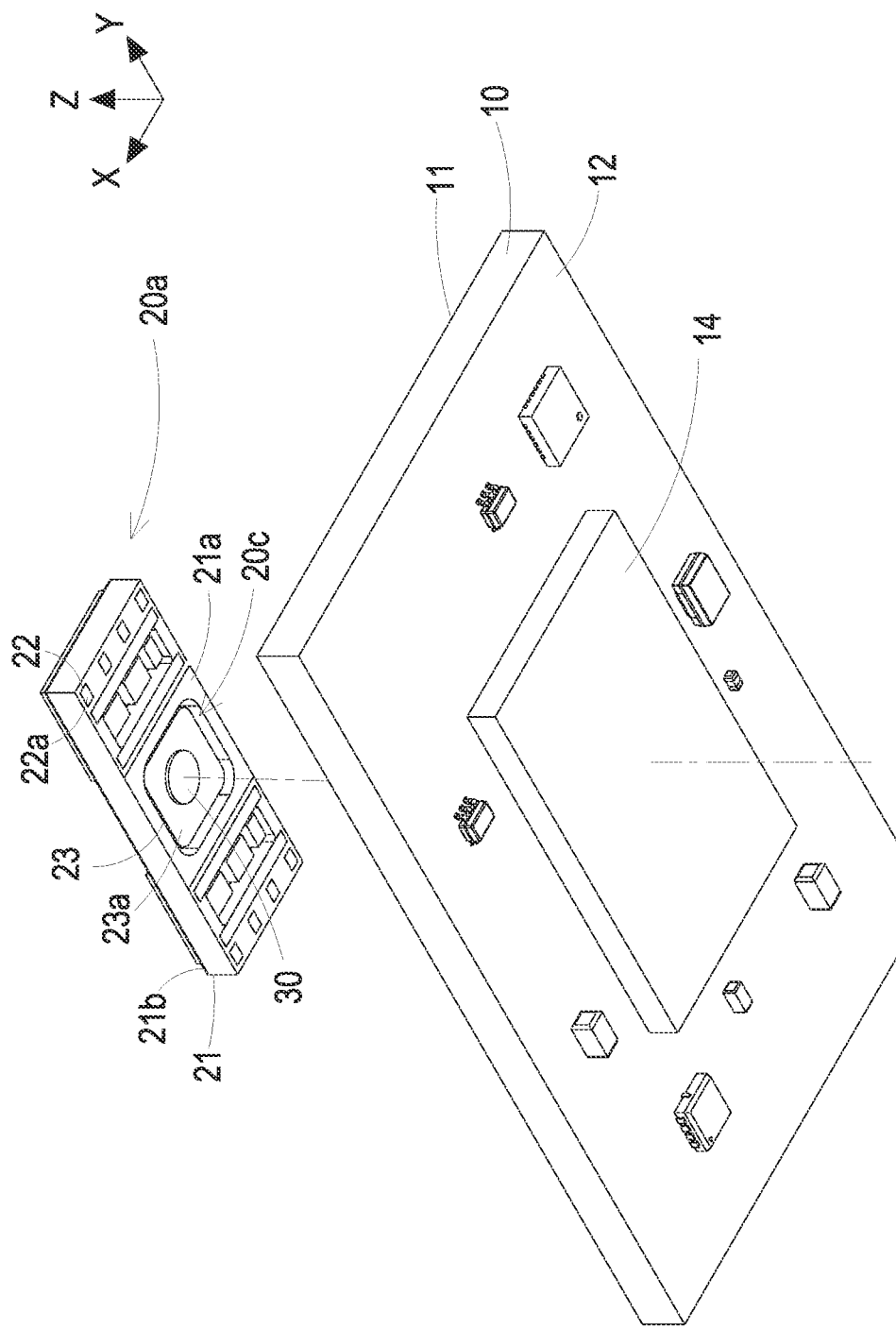
FIG. 16 is an exploded view illustrating the electronic module assembly structure according to the fifth embodiment of the present disclosure and taken from another perspective.

FIG. 15 and FIG. 16 are exploded views illustrating an electronic module assembly structure according to a fifth embodiment of the present disclosure. In the embodiment, the electronic module assembly structure 1d is similar to the electronic module assembly structure 1b shown in FIGS. 8 to 13, and the same labels of the components represent the same components, structures and functions, not redundantly described herein. In the embodiment, the electronic module assembly structure 1d includes a system board 10, an electronic module 20a and an adhesive material 30. The prefabricated electronic module 20a is an integrated surface mount module formed by the first circuit board 21. In the embodiment, the first circuit board 21 includes a groove structure 20c and the magnetic core component 23 served as the carrier is at least partially disposed within the groove structure 20c correspondingly. Preferably but not exclusively, the plurality of leading pins 22 are through-hole structures, embedded in the first circuit board 21. Moreover, the soldering surface 22a is electrically connected with the corresponding leading pin 22 to form a rectangular surface exposed on the second lower surface 21a of the first circuit board 21 to form a pad structure, but the present disclosure is not limited thereto. In the embodiment, the magnetic core component 23 served as the carrier is embedded in the first circuit board 21, and partially passes through the first circuit board 21 for connection. In the embodiment, the magnetic core component 23 served as the carrier is located at the geometric center area of the first circuit board 21. Preferably but not exclusively, in the integrated electronic module 20a, the carrying surface 23a provided by the magnetic core component 23 served as the carrier and the soldering surfaces 22a of the leading pins 22 form a height difference in the Z axial direction, so that there is enough space provided for pre-dispensing the adhesive material 30. When the integrated electronic module 20a is placed on the first upper surface 11 of the system board 10 for the first reflow soldering process, the adhesive material 30 is cured and firmly bonded to the electronic module 20a and the system board 10. At the same time, the soldering of the leading pins 22 and the system board 10 is enhanced, the integrity and the reliability of the entire structure is enhanced, the assembling process is simplified, and the manufacturing cost is reduced. In addition to facilitating the assembly of the magnetic core component 23, the overflow of the adhesive material 30 due to the glue-dispensing operation is avoided. Certainly, the present disclosure is not limited thereto. In the embodiment, the electronic module 20a includes the groove structure 20c located at a geometric center area thereof for accommodating the magnetic core component 23. Moreover, the electronic module 20a further includes a groove structure located nearby the inner side of the leading pins 22 for accommodating a resin block and a copper block. Preferably but not exclusively, the height of the resin block and the copper block disposed on the second lower surface 21a of the first circuit board 21 is lower than the height of the soldering surfaces 22a of the leading pins 22 disposed on the second lower surface 21a of the first circuit board 21, so that there is enough space provided for pre-dispensing the adhesive material 30.

In summary, the present disclosure provides an electronic module assembly structure. For the surface-mount electronic module disposed on the system board through the reflow soldering process, the height difference between the carrier and the soldering surfaces of the leading pins in the electronic module is used for pre-dispensing adhesive material on the carrying surface of the at least one carrier or the system board corresponding to the carrying surface of the carrier. When the leading pins and the system board are connected through the reflow soldering process, the adhesive material between the carrier and the system board is completely cured into a solid state during the reflow pre-heating process, the electronic module and the system board are firmly bonded, and the cured adhesive material is maintained in the stable state in the subsequent reflow soldering process at high temperature instead of being melted due to the high temperature of the reflow soldering process. Since the carrier and the leading pins on the electronic module are prefabricated, the height difference between the carrier and the leading pins can be adjusted according to the practical requirements. No additional processing is required. When the leading pins of the electronic module are in contact with the system board, the height of the carrying surface of the carrier is lower than the height of the soldering surfaces of the leading pins, and the carrying surface is not in direct contact with the system board. Therefore, there is enough space provided between the carrier and the system board for accommodating the adhesive material. The adhesive material is disposed on the carrying surface of the at least one carrier or the system board corresponding to the geometric center area of the carrier by dispensing. The electronic module is bonded to the system board, so that the soldering surfaces of the leading pins on the periphery of the adhesive material remain connected to the system board. It helps to improve the reliability of the first reflow soldering process and ensures that the problem of falling parts of the electronic module does not occur during the subsequent second reflow soldering process. Furthermore, the curing process of the adhesive material combined with the preheating process of reflow soldering not only simplifies the assembling and manufacturing process, but also improves the reliability of the entire assembly structure and reduces the cost. The components such as a magnetic core component, a resin block and a copper block pre-bonded on the first circuit board of the electronic module can be served as the carriers to form carrying surfaces lower than the soldering surfaces of the leading pins in height. Different from the leading pins arranged on the outer periphery of the electronic module, the carrier such as the magnetic core component, the resin block and the copper block provide carrying surfaces, which are closer to the geometric center of the electronic module. When the electronic module is bonded with the system board by the adhesive material between the carrier and the system board, the supporting force provided by the adhesive material is located at the geometric center area of the electronic module or the carrying surface of the at least one carrier, which can firmly support the electronic module. In that, the leading pins are firmly soldered to the system board by reflow soldering, and the excellent bonding force and heat resistance of the cured adhesive material are maintained to ensure that the electronic module will not fall off in the subsequent reflow soldering process. On the other hand, in case of that the magnetic core component is served as the carrier, the type of the magnetic core component disposed on the first circuit board can be adjusted according to the practical requirements. As the magnetic core component is further used to form an inductor or a transformer, the setting of the adhesive material is not affected. Furthermore, the main weight of the electronic module is provided by the magnetic core component. When the magnetic core component is severed as the carrier, and the adhesive material is solidified to bond the electronic module and the system board, the electronic module and the system board can be connected effectively. In addition, in conjunction with the second circuit board to form an integrated electronic module, the soldering surfaces of the leading pins further form a pad structure on the third lower surface of the second circuit board, and the carrier is at least partially arranged in the groove structure of the second circuit board. In that, it is beneficial to form a height difference between the carrier and the soldering surfaces of the leading pins, and the adhesive material is pre-dispensed on the carrying surface of the at least one carrier or the system board corresponding to the carrying surface of the carrier. When the integrated electronic module is placed on the system board for the reflow soldering process, the adhesive material is cured and firmly bonded between the electronic module and the system board, and the soldering of the leading pins and the system board is enhanced. Thus, the integrity and the reliability of the entire structure are enhanced, the assembling process is simplified and the manufacturing cost is further reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An electronic module assembly structure, comprising:
a system board comprising a first upper surface and a first lower surface opposite to each other;
an electronic module spatially corresponding to the first upper surface of the system board, and comprising a plurality of leading pins and at least one carrier, wherein each of the plurality of leading pins has a soldering surface and is connected to the first upper surface of the system board through a first reflow soldering process, wherein the at least one carrier has a carrying surface, wherein when the plurality of leading pins are connected to the first upper surface of the system board, a height difference is formed between the carrying surface of the at least one carrier and the soldering surface of the plurality of pins; and
an adhesive material disposed on the carrying surface of the at least one carrier or the first upper surface of the system board corresponding to the carrying surface, wherein the adhesive material connects the at least one carrier of the electronic module with the first upper surface of the system board, so that the electronic module is fixed to the first upper surface of the system board through the adhesive material.

2. The electronic module assembly structure according to claim 1, wherein the electronic module further comprises a first circuit board having a second upper surface and a second lower surface opposite to each other, the second lower surface is disposed adjacent to the first upper surface, and the at least one carrier is disposed on the second lower surface of the first circuit board by bonding or welding.

3. The electronic module assembly structure according to claim 2, wherein each of the plurality of leading pins is composed of a copper bar, and the copper bar is pre-set on the second lower surface of the first circuit board by welding.

4. The electronic module assembly structure according to claim 2, wherein the electronic module further comprises a second circuit board having a third upper surface and a third lower surface opposite to each other, the third upper surface of the second circuit board and the second lower surface of the first circuit board are connected by welding, the second circuit board comprises at least one groove structure, and the at least one carrier is at least partially disposed within the at least one groove structure correspondingly.

5. The electronic module assembly structure according to claim 4, wherein the plurality of leading pins are exposed on the third lower surface and sidewalls of the second circuit board, wherein the soldering surfaces of the plurality of pins are exposed on the third lower surface to form a pad structure.

6. The electronic module assembly structure according to claim 2, wherein the first circuit board comprises at least one groove structure, and the at least one carrier is at least partially disposed within in the at least one groove correspondingly, wherein the soldering surfaces of the plurality of leading pins are exposed on the second lower surface of the first circuit board to form a pad structure.

7. The electronic module assembly structure according to claim 2, wherein the at least one carrier comprises a magnetic core component disposed on the second lower surface of the first circuit board, and the carrying surface is disposed on a top surface of the magnetic core component.

8. The electronic module assembly structure according to claim 2, wherein the at least one carrier comprises a magnetic core component, and the magnetic core component comprises a first magnetic core and a second magnetic core, which are disposed on the second lower surface and the second upper surface of the first circuit board, respectively, and partially passing through the second lower surface and the second upper surface to connect with each other, wherein the carrying surface is arranged on a top surface of the first magnetic core.

9. The electronic module assembly structure according to claim 2, wherein the at least one carrier comprises a magnetic core component, and the electronic module further comprises a conductor, which is wound around the magnetic core component and forms an inductor or a transformer with the magnetic core component.

10. The electronic module assembly structure according to claim 9, wherein the conductor is embedded in the first circuit board.

11. The electronic module assembly structure according to claim 9, wherein the conductor is soldered to the first circuit board.

12. The electronic module assembly structure according to claim 2, wherein the electronic module comprises at least one electronic component pre-set on the second upper surface and/or the second lower surface of the first circuit board.

13. The electronic module assembly structure according to claim 2, wherein the at least one carrier is located at a geometric center area of the first circuit board.

14. The electronic module assembly structure according to claim 1, wherein the at least one carrier comprises at least one of a magnetic core component, a copper block and a resin block, and the at least one carrier is disposed on the electronic module by welding or bonding.

15. The electronic module assembly structure according to claim 1, wherein the height difference is ranged from 0.1 mm to 2 mm.

16. The electronic module assembly structure according to claim 1, wherein the system board comprises a plurality of first electronic devices disposed on the first upper surface through the first reflow soldering process.

17. The electronic module assembly structure according to claim 1, wherein the system board comprises a plurality of second electronic devices disposed on the second lower surface through a second reflow soldering process.

18. The electronic module assembly structure according to claim 1, wherein the adhesive material is made of a thermosetting plastic.

19. The electronic module assembly structure according to claim 1, wherein the adhesive material is pre-disposed on the system board corresponding to a geometric center area of the carrying surface by dispensing, and cured in the first reflow soldering process to bond the electronic module and the system board.

20. The electronic module assembly structure according to claim 1, wherein the electronic module is a power conversion module.

21. The electronic module assembly structure according to claim 1, wherein the electronic module is a surface mount module.

* * * * *